United States Patent [19]

Choo et al.

[11] Patent Number: 5,133,286
[45] Date of Patent: Jul. 28, 1992

[54] SUBSTRATE-HEATING DEVICE AND BOAT STRUCTURE FOR A VACUUM-DEPOSITING APPARATUS

[75] Inventors: Dhe H. Choo, Kyungki-do; Ie H. Song, Seoul, both of Rep. of Korea

[73] Assignee: Samsung Electro-Mechanics Co., Ltd., Soowun, Rep. of Korea

[21] Appl. No.: 511,436

[22] Filed: Apr. 13, 1990

[30] Foreign Application Priority Data

Apr. 14, 1989 [KR] Rep. of Korea .......................... 4940
Nov. 25, 1989 [KR] Rep. of Korea .......................... 17567

[51] Int. Cl.$^5$ .............................................. C23C 14/24
[52] U.S. Cl. ..................................... 118/725; 118/726
[58] Field of Search ................................ 118/725, 726

[56] References Cited

U.S. PATENT DOCUMENTS 3,281,517 10/1966 Hemmer ............................. 118/726
3,333,982 8/1967 Horn .................................. 118/726
4,217,856 8/1980 Kraus ................................. 118/724

Primary Examiner—Richard Bueker
Attorney, Agent, or Firm—Cushman, Darby & Cushman

[57] ABSTRACT

A substrate-heating device and a boat structure for a vacuum depositing apparatus that is capable of depositing semiconductor film onto a substrate more uniformly. The substrate-heating device includes a plurality of divided heating blocks which are capable of detecting and controlling their respective temperatures separately and independently. The substrate-heating device further includes a plurality of substrate holders for holding substrates, these substrate holding being driven by motor, through a transmission gear, a plurality of divided heating blocks for heating substrates, and boat structure for evaporating the depositing material within a vacuum chamber. The heating blocks, except a top portion, are structured with C-G heaters, ceramic tubes, heat-conductive protecting support plates and heat-radiating conductive plate, as well as thermocouples, so that temperature differences among each portion of the heating blocks can be controlled separately and independently so that more uniform depositing of semiconductor film onto the substrates can be obtained.

3 Claims, 4 Drawing Sheets

SUBSTRATE-HEATING DEVICE AND BOAT STRUCTURE FOR A VACUUM-DEPOSITING APPARATUS

BACKGROUND OF THE INVENTION

The present invention relates to a vacuum deposition apparatus capable of depositing a thin film composed of constant composition, from components which have different vapor pressures at a constant temperature, for manufacturing uniform products, and particularly to a substrate-heating device, and boat structure, for a vacuum depositing apparatus. The substrate-heating device is provided with a plurality of heating blocks with predetermined-distance intervals respectively between them, in conjunction with the form of the substrate holder, so as to decrease temperature differences among various portions of the substrate at the time of heating. The temperature of each heating block is separately and independently controlled so that, even if the temperature differences occur on the substrate at the time of heating the substrate, input to the respective blocks is changed thereby easily evening-out the temperature of the substrate. The boats for containing the material, which is to be evaporated or sublimated and deposited on the substrate, are mounted at the bottoms thereof, in sliding clamp-type mounting devices for counterbalancing thermal expansion of the boats themselves, so as to extend the useful lives of the boats.

Usually, for example, in a case when a compound semiconductor material which is composed of constituents which are different in vapor pressure from one another at a working temperature, such as indium antimonite, InSb, the temperature and pressure within the interior of the depositing chamber are important operating parameters. When the pressure is constantly maintained within a vacuum in a depositing chamber, the antimony, Sb, of the compound indium antimonite, InSb, can be instantly unintentionally re-evaporated due to temperature differences within the interior of the depositing chamber, so that the film that is vacuum-deposited on the surface of the substrate mounted on the substrate holder is not uniformly composed.

Consequently, the greater the temperature difference among various regions of the substrate is, the more anisotropic is the deposited film. Therefore, it is desirable to reduce as much as possible the temperature differences among various regions of substrates existing at the time of heating. Conventionally, as devices for heating the substrate in vapor-depositing apparatus, there has been mainly used halogen lamps as shown at 31 in FIG. 6A, and also there has been conventionally practiced a method for heating a plurality of substrate regions by simultaneously using halogen lamps 31 and C-G heaters 32, as shown in FIG. 6B.

However, in former case, not only is the difference of heating great according to the angle at which light radiated from the halogen lamp 31 is directly irradiated onto the substrate mounted on the substrate holder 33, but also, heat loss caused by heat dispersion within the interior of chamber, which is substantially larger than the substrate 34 requires increased heating, whereby temperature differences among portions of the substrate 34 are great. If a thermocouple 35 is used for detecting the temperature within the interior of chamber and it is disposed at a predetermined location for compensating for differences in the temperature of the substrate, a standard temperature setting is difficult, and, even if a standard temperature is set, temperature differences are great. Therefore, there has remained a problem in temperature control of the substrate.

In the case of simultaneously using both a halogen lamp 31 and a C-G heater 32, and the C-G heater 32 is provided at immediately above the substrate 33 for directly heating the substrate, since a heat-dispersing device capable of uniformly distributing the heat radiated from the C-G heater 32 is not present, heat differences between the portion immediately below the heater and the portion between the two heaters is great. Therefore, even if the substrate is substantially heated, temperature differences among respective portions of the substrate have occurred.

When a semiconductor film is deposited under the above-described uneven heating conditions, since the temperature differences among respective portions of the substrate are great, many instances of anisotropic characteristics in the deposited films have occurred.

Further, since the boat from which the film-forming material is evaporated is connected directly to the power-feeding electrodes, heat-expansion of the boat cannot be counterbalanced in case of a prior art ceramic boat (BN or $Al_2O_3$). Accordingly, the boat can be bent or cracked. Consequently, uniform heating of an entire boat has been difficult.

SUMMARY OF THE INVENTION

Therefore, it is an object of the present invention to provide a substrate-heating device in which a plurality of divided heating blocks is arranged with predetermined distance intervals among the blocks, in relation to the forms of the substrate holder or holders within a vacuum depositing apparatus. The substrate-heating device includes means providing a heating power control function having a temperature control function for each blocks themselves, and thermocouples, for reducing the temperature difference between substrate portions located closer to heaters and substrate portions located between heaters. The heating blocks are each provided with a heat-radiating conductive plate made of molybdenum sheet on whole of the surface of the heating portion for heating substrate in each holder.

Another object of the present invention is to provide a boat structure in which the boat is connected to the electrodes by sliding clamp-type connectors, so that thermal expansion and contraction of the boat can be accommodated.

BRIEF DESCRIPTION OF THE DRAWINGS

The forgoing and other objects as well as advantages of the present invention will become clearer from the following description of the invention, which is made with reference to the accompanying drawings, in which:

FIGS. 6A to 6C are schematic, fragmentary longitudinal cross-sectional views illustrating a conventional substrate heating apparatus, in which FIG. 6A shows a heating apparatus using halogen lamps, FIG. 6B shows a heating apparatus simultaneously using halogen lamps and C-G heaters, and FIG. 6C shows a heating apparatus utilizing molybdenum, tungsten, and C-G heaters.

Throughout the drawings, like reference numerals and symbols are used for designating like or equivalent parts or portions, for simplicity of illustration and explanation.

DETAILED DESCRIPTION OF THE PREFERRED EMBODIMENT

Figure 1:
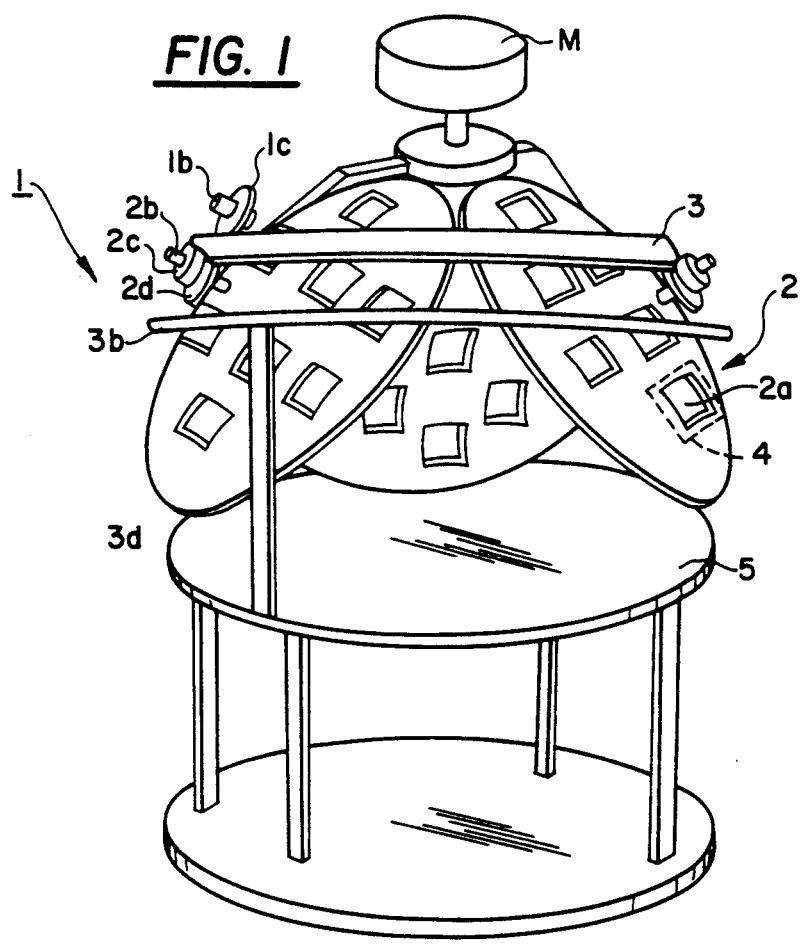
FIG. 1 is a perspective view generally showing the substrate-heating portion of a vacuum-depositing apparatus, from which the enclosing chamber wall has been omitted so as to expose structure otherwise obscured thereby.

Hereinafter, a preferred embodiment of the present invention will be described in detail with reference to the accompanying drawings.

As shown in FIGS. 1, 2, 3A and 3B, a plurality of substrate holders 2 each having a respective substrate holder center shaft 2b, a planetary gear 2c and a planetary roller 2d is provided. The planetary gear of each substrate holder 2 is meshed with a ring gear 3 and the ring gear 3 is meshed with a driving gear 1c coupled to a motor M through a transmission gear (not shown). The planetary rollers 2c are supported on a guide rail 3b, which is supported by guide rail supporters 3c, 3d, so that the substrate holders 2 are rotated around their respective center shafts 2a and simultaneously revolved along the ring gear 3 around the center axis of the chamber 1a. In use, substrates 4 are attached on each substrate holder 2 so as to have surfaces exposed through rectangular holes 2a provided in the substrate holders 2. During the time that the substrate holders 2 are rotating around their center shafts 2b and simultaneously revolving around center axis of chamber 1a, a semiconductor film is deposited on the exposed surfaces of the substrate 4 by heating in a vacuum and thereby evaporating or subliming material of a selected composition, such as indium antimonite, InSb, which is contained within the grooves 6A of one or more boats 6 which are provided on the support table 5 within the chamber 1a.

Figure 2:
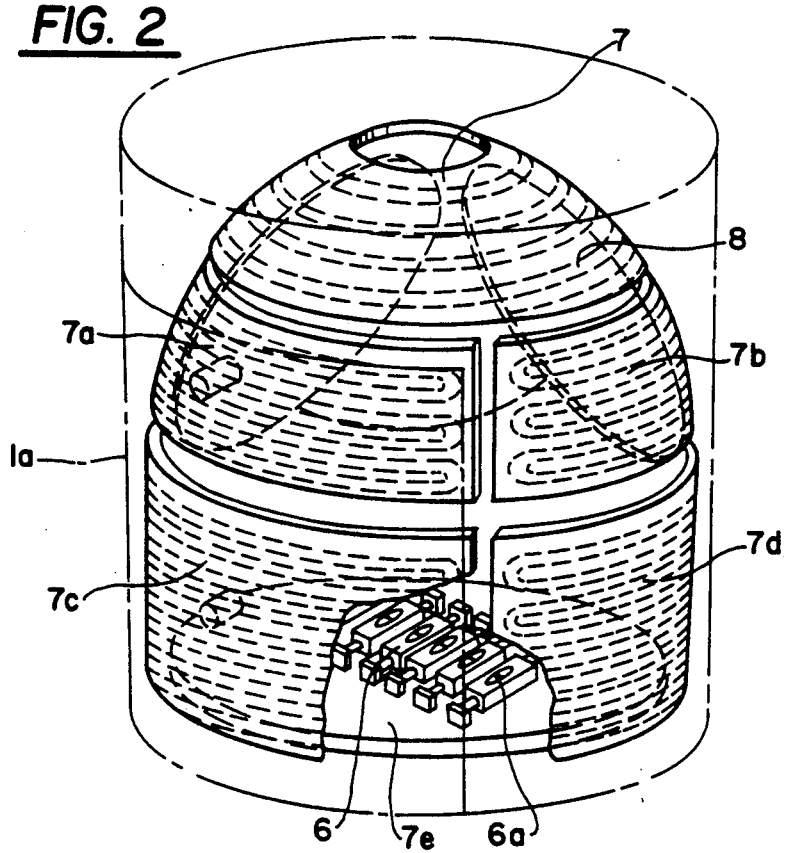
FIG. 2 is another perspective view of the apparatus, with the chamber wall shown in phantom lines and the heaters partly cut-away, for showing an example of the heating blocks and boats of a preferred embodiment of the present invention.
Figure 3A:
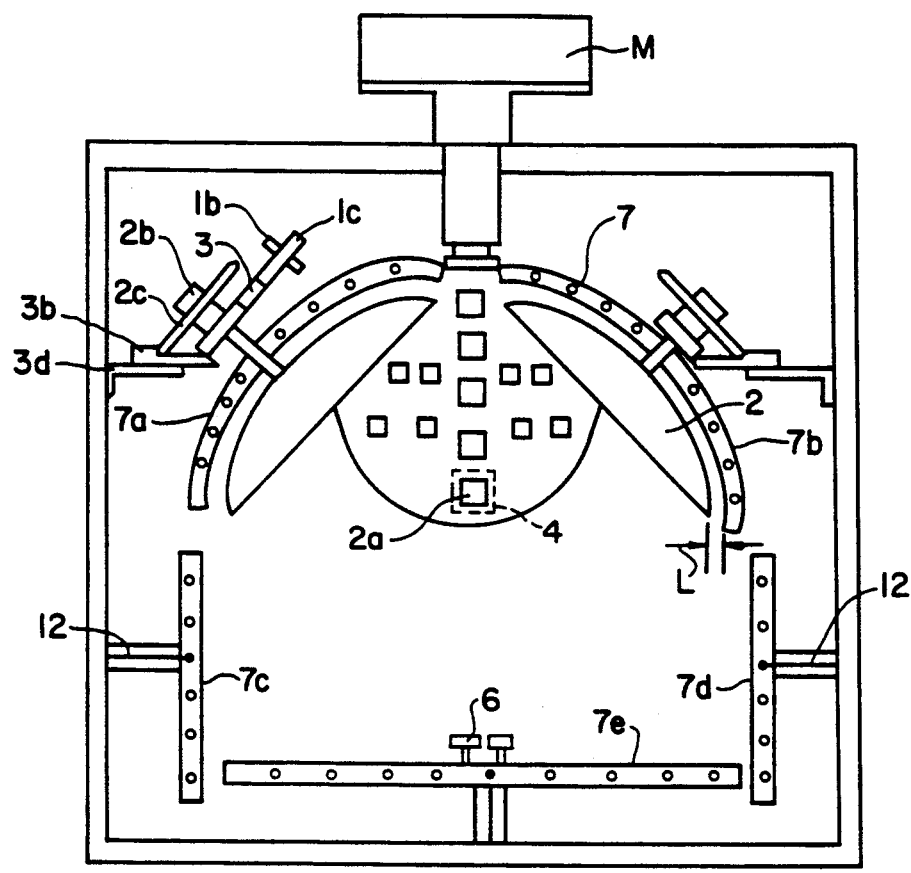
FIG. 3A is a longitudinal cross-sectional view illustrating a state in which the heating device of the present invention is arranged for use.
Figure 3B:
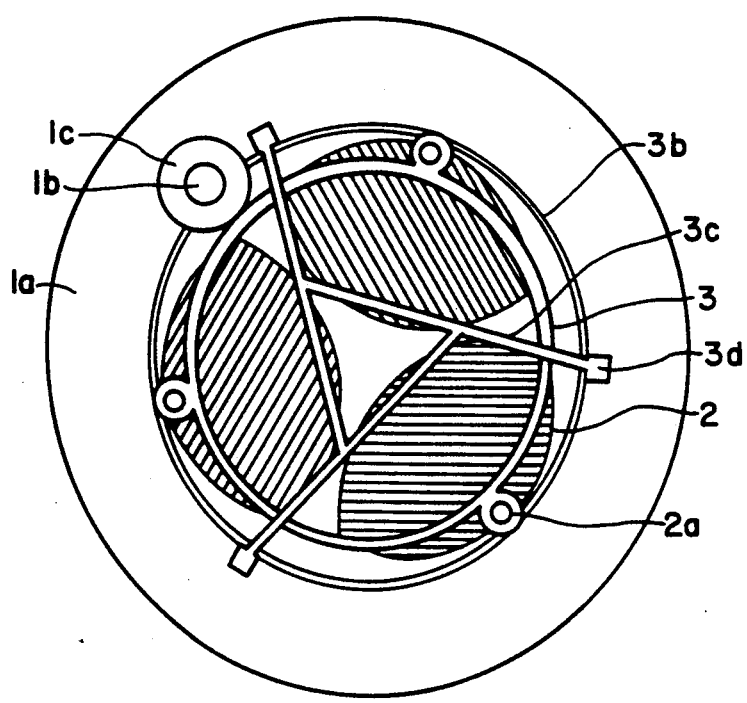
FIG. 3B is a top plan view showing means for providing for rotation of substrate holder 2 around its center shaft simultaneously with revolution around center axis of chamber, the motor which provides the rotation and revolution having been omitted from this view.

Further, as shown in FIGS. 2 and 3A, divided heating blocks 7a, 7b, 7c, 7d, 7e are mounted within the chamber 1a, each is structured in such a manner that a temperature control function is for each heating block so that, when any temperature differences among substrates 4 attached on the substrate holders 2 are detected, the heating temperature of the corresponding heating block is controlled. Each heating is constructed so as to permit the shape of the heating blocks to be individually controlled.

A top heating block 7 located at the top within the chamber 1a is formed as a single body having a shape resembling that of a bamboo hat, and heater 8 is arranged helically and has a semi-spherical shape.

One part of the partial heating blocks 7a, 7b (which are divided equally into two parts located under the top heating block 7 within top space of the chamber) is mounted to the side wall of the chamber by a conventional supporting means, and another, opposite part is mounted to the inside of door of the chamber, and maintained a short distance from the substrate holders 2.

One part of the partial cylindrical heating blocks 7c, 7d (which are divided equally into two parts symmetrically) is mounted to the side wall of the chamber, and another, opposite part is mounted to the inside of the door of the chamber, so that when the door is opened, the one part of the partial spherical heating block 7a, corresponding to a half part of partial spherical shape, and the one part of the partial cylindrical heating block 7c being a half part of partial cylindrical shape, are opened together with the door and thereby each substrate 4 can be attached to or removed from a respective substrate holder 2.

A disc-type heating block 7e is mounted on the bottom of the depositing chamber 1a, surrounded by those heating blocks, i.e., on the table 5. Boats 6 for holding evaporating indium antimonite, InSb, are mounted on this heating block 7e so as to maintain a predetermined height. Heaters 8a–8e of the heating blocks 7a–7e, except the top heating block 7, are arranged in a zigzag pattern.

Heat radiated from the heaters 8–8e arranged within the heating blocks 7–7e surrounding from the substrate holder 2 and onto the table 5, is caused to be uniformly dispersed on each substrate 4 attached to each substrate holder 2, without dispersing to the exterior, so that temperature differences among the substrates can be minimized.

In order to fundamentally reduce the temperature differences on and among the substrates, means for separately controlling heating power is provided for the respective heating blocks (7–7e), to which respective thermocouples 12 are provide, and the temperature of each substrate attached to a respective substrate holder is checked, so that temperature compensation of the substrates is possible at all points.

For example, in a case where it is assumed that distance L between the heating blocks (7–7e) and a substrate holder 2 is 100 mm±2 mm, and the setting point of the substrate temperature is 380° C., when a temperature difference between portions occurs due to differences in heating level and the like during depositing, the temperature is checked for each of the portions of the substrate material attached to the respective substrate holders 2, whereby the power input to the heating block corresponding to a respective portion of substrate is changed, so that the temperature difference of each substrate can be desirably reduced to be ±1° C. up to 380° C.

Figure 4:
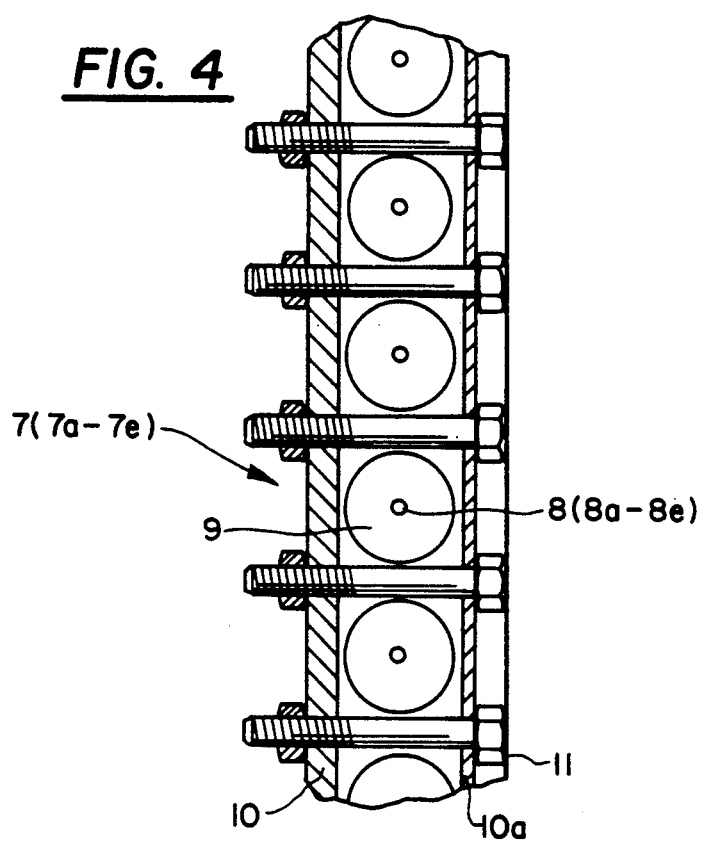
FIG. 4 is a fragmentary, larger scale cross-sectional view illustrating a preferred structure for the heating blocks of the apparatus of the present invention.

FIG. 4 is a fragmentary larger-scale longitudinal cross-sectional view illustrating details of a preferred structure for the heating block of the present invention.

In FIG. 4, cylindrical ceramic tubes 9 cover the W, Mo, C-G and heaters (8–8e) of heater blocks 7–7e, and heat-conductive protecting support plates 10, 10a are fixed from both sides in a sandwich structure about the heater blocks 7–7e by bolts and nuts. The ceramic tubes 9 are gradually heated by the heaters 8–8e and, as a result, heat is conducted to the heat-conductive protecting support plates 10, 10a, and to a a respective radiating conductive plate 11 made of molybdenum sheet, which is attached to the outside of one of the protecting plates 10, 10a neighboring a respective substrate holder 2, by means of which the substrates 4 are heated.

Therefore, since the heat radiated from the heater reaches the substrates 4 in a state that whole of heating blocks are equally heated by the conduction of metals, the temperature of the substrates can be uniformly maintained, and since film deposition on the substrates is carried out within an interior chamber space that is surrounded by the heating blocks, if it should happen that one of the substrate holders 2 becomes smeared by some depositing material, the respective radiating conductive plate 11 attached to the respective heating block can be easily changed, so that cleaning work of the vacuum depositing apparatus can be easily carried out.

Figure 5:
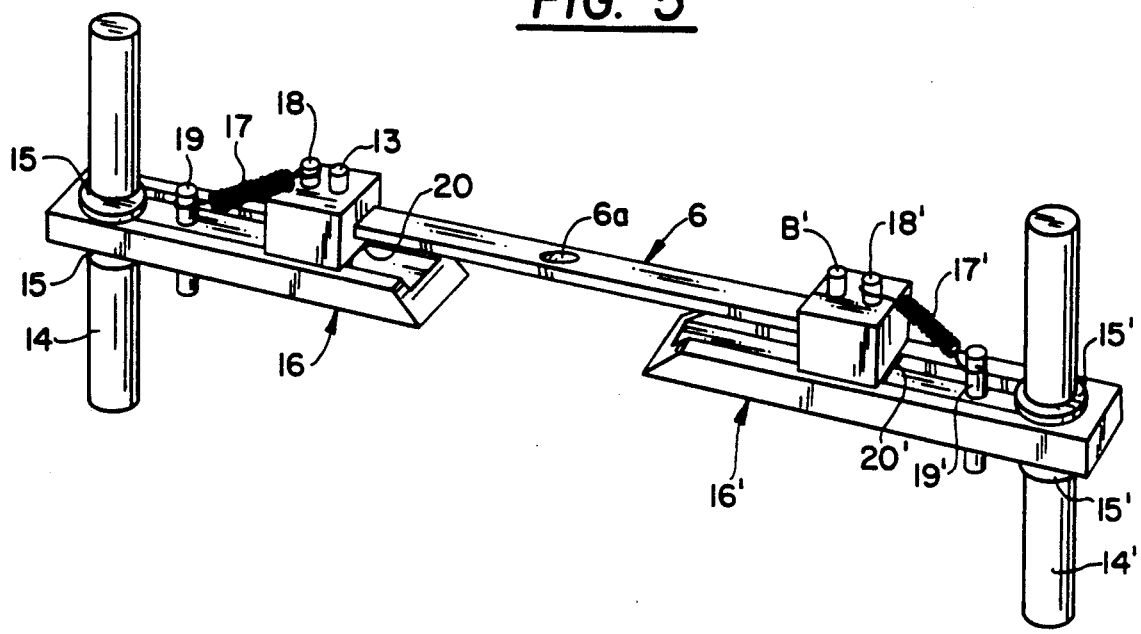
FIG. 5 is a perspective view showing a preferred structure for the boat of the apparatus of the present invention.
Figure 6A:
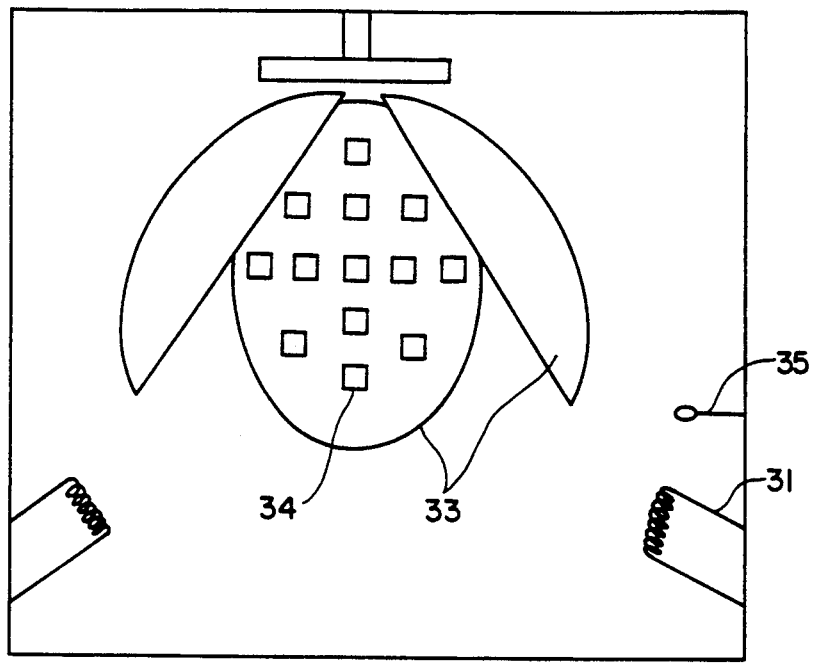
Figure 6B:
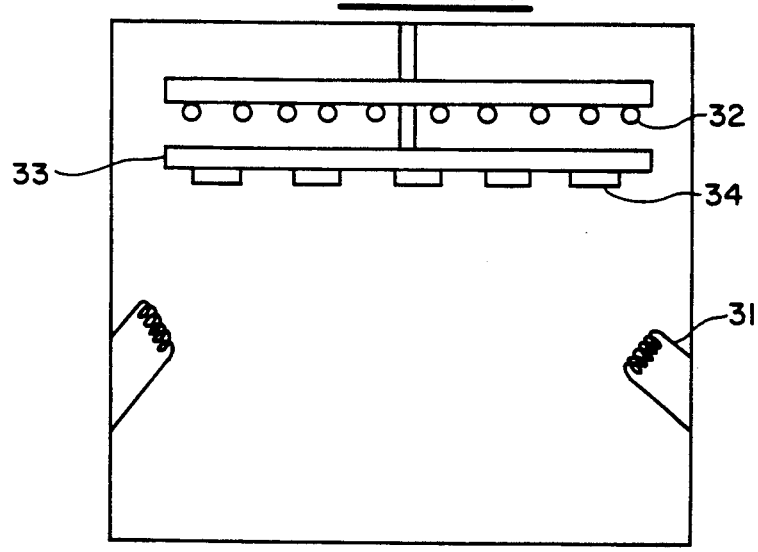
Figure 6C:
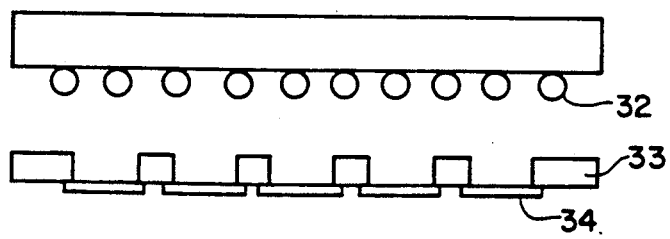

FIG. 5 is a fragmentary perspective view illustrating the preferred structure of a boat 6 of the present invention. The boat 6 is fixed to each of the fixing blocks 20a, 20a' by holding bolts 13, 13'. The fixing blocks 20a, 20a' are placed respectively on the sliding guide plates 16, 16', which are fixed to the electrode supporting rings 15, 15'. The securements are made after inserting to the electrodes 14, 14', respectively, and respective one ends of tensional coil spring wires 17, 17' are connected to respective fixing bolts 18, 18' and respective other ends of the tensional coil spring wires 17, 17' are connected to respective fixing bolts 19, 19'. Elements 20, 20' are rollers for rolling the fixing blocks 20a, 20a' on the rails of the sliding guide plates 16, 16'.

When the boat 6 is heated in order to deposit a film on the substrates 4, the boat 6 is thermally expanded as the temperature is raised. Accordingly, the length of the boat 6 is extended by said thermal expansion, and, since the boat 6 is held by the bolts 13, 13' to the fixing blocks 20a, 20a', respectively, the fixing blocks 20a, 20a' correspondingly slide outward, i.e., toward the electrodes 14, 14', respectively, on the rollers 20, 20' on the sliding guide plates 16, 16'.

Conversely, when the boat 6 contracts, the fixing blocks 20a, 20a' slide inward, i.e., away from the electrodes 14, 14', respectively, on 20, 20' on the sliding guide plates 16, 16'. The amount of contraction of the boat 6 is accommodated by the tensional coil spring wires 17, 17', respectively.

When the boat 6 is heated during depositing of a film, the boat 6 remains substantially at the same location according to the attractive force and repulsive force of said tensional coil spring wires 17, 17', and therefore, deposition of the film on the substrates can be uniformly carried out.

Thus, the present invention has advantages that the heating blocks are arranged by dividing them and keeping a predetermined distance within the spatial region from the substrate holders to the table of the vacuum depositing apparatus. When the temperature of each portion of the heater becomes above or below the setting temperature for each of the heating blocks, this is detected and the temperature is self-controlled. Therefore, the temperature difference can be simply controlled, so that a semiconductor film can be uniformly deposited on the substrates 4, and also the cleaning work can be easily carried out by attaching radiating heat-conductive plates made of molybdenum sheet on the whole surface of heating portion of the substrate holder.

It will be appreciated that the present invention is not restricted to the particular embodiment that has been described hereinbefore, and that variations and modifications may be made therein without departing from the spirit and scope of the invention as defined in the appended claims and equivalents thereof.

What is claimed is:

1. A vacuum depositing apparatus for vacuum-depositing a film on exposed surfaces of a plurality of substrates, said apparatus comprising:

a table disposed in a space which is enclosed by wall means defining a chamber;

a substrate heater arranged in a shell within said space, said heater comprising a plurality of heating blocks, each including an electric heating element disposed within a respective ceramic tube which covers the respective said electric heating element; said ceramic tube covered electric heating elements being sandwiched between inner and outer heat-conducting support plates; and said inner heat-conducting supporting plates being covered on inner sides thereof which face said table, by a replaceable heat-radiating conductive plate made of molybdenum; means for independently controlling heating of said electric heating elements, including respective thermocouple elements for sensing temperature at a plurality of sites within said space and for increasing and decreasing electrical power to respective of said electric heating elements depending on such sensing, for evening-out heating of substrates as provided by said substrate heater;

means for supporting a plurality of substrates in said chamber to be heated by said substrate heater;

boat means enclosed within said space and including recess means for containing material to be evaporated or sublimed for deposition as a film on said substrates; and electrodes operatively connected to said boat means for heating said boat means for causing said material to evaporate or sublime.

2. The vacuum depositing apparatus of claim 1, wherein:

said heating blocks include a downwardly concave unitary semi-spherically curved heating block, two complementary part-spherically curved heating blocks, surmounting two-complementary semi-cylindrically curved heating blocks, disposed over a horizontal disc-like heating block.

3. The vacuum depositing apparatus of claim 1, wherein:

said boat means comprises at least one boat bar having a said recess means formed generally medially therein:

said electrodes include two laterally spaced electrodes, respectively having rail means which extend medially towards one another;

said bar having means at each end thereof supporting the respective end on a respective said rail means for reciprocating movement along said rail means as said bar expands and contracts; and respective tension coil means anchoring each end of said bar with respect to a site on a respective said rail means, so that as said bar expands and contracts, said recess means thereof tends to remain centered between said electrodes.

* * * * *